United States Patent
Tan et al.

(10) Patent No.: US 11,302,520 B2
(45) Date of Patent: Apr. 12, 2022

(54) CHAMBER APPARATUS FOR CHEMICAL ETCHING OF DIELECTRIC MATERIALS

(71) Applicant: Applied Materials, Inc., Santa Clara, CA (US)

(72) Inventors: Tien Fak Tan, Campbell, CA (US); Dmitry Lubomirsky, Cupertino, CA (US); Kirby H. Floyd, San Jose, CA (US); Son T. Nguyen, San Jose, CA (US); David Palagashvili, Mountain View, CA (US); Alexander Tam, Union City, CA (US); Shaofeng Chen, Austin, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/747,367

(22) Filed: Jun. 23, 2015

(65) Prior Publication Data

US 2015/0380220 A1    Dec. 31, 2015

Related U.S. Application Data

(60) Provisional application No. 62/018,602, filed on Jun. 28, 2014.

(51) Int. Cl.
*H01J 37/32* (2006.01)

(52) U.S. Cl.
CPC .. *H01J 37/32724* (2013.01); *H01J 37/32522* (2013.01); *H01J 37/32715* (2013.01)

(58) Field of Classification Search
CPC ........... H01J 37/32522; C23C 16/4586; C23C 16/4581; C23C 16/463
(Continued)

(56) References Cited

U.S. PATENT DOCUMENTS

| 5,059,770 A | 10/1991 | Mahawili |
| 5,775,416 A * | 7/1998 | Heimanson ............ C23C 14/50 |
| | | 118/725 |

(Continued)

FOREIGN PATENT DOCUMENTS

| CN | 102197156 A | 9/2011 |
| CN | 102210196 A | 10/2011 |

(Continued)

OTHER PUBLICATIONS

Korean Office Action dated Jul. 29, 2021 for Application No. 10-2015-0090597.

(Continued)

*Primary Examiner* — Charlee J. C. Bennett
(74) *Attorney, Agent, or Firm* — Patterson + Sheridan, LLP

(57) ABSTRACT

Implementations of the disclosure generally provide an improved pedestal heater for a processing chamber. The pedestal heater includes a temperature-controlled plate having a first surface and a second surface opposing the first surface. The temperature-controlled plate includes an inner zone comprising a first set of heating elements, an outer zone comprising a second set of heating elements, the outer zone surrounding the inner zone, and a continuous thermal choke disposed between the inner zone and the outer zone, and a substrate receiving plate having a first surface and a second surface opposing the first surface, the second surface of the substrate receiving plate is coupled to the first surface of the temperature-controlled plate. The continuous thermal choke enables a very small temperature gradient to be created and manipulated between the inner zone and the outer zone, allowing center-fast or edge-fast etching profile to achieve on a surface of the substrate.

9 Claims, 4 Drawing Sheets

(58) Field of Classification Search
USPC .................. 118/715–733; 156/345.1–345.55
See application file for complete search history.

(56) References Cited

U.S. PATENT DOCUMENTS

| | | | |
|---|---|---|---|
| 6,035,101 A * | 3/2000 | Sajoto ..................... C23C 16/46 | 392/416 |
| 6,054,688 A * | 4/2000 | Moschini .......... H01L 21/67109 | 118/725 |
| 6,669,783 B2 | 12/2003 | Sexton et al. | |
| 6,902,622 B2 * | 6/2005 | Johnsgard ......... C23C 16/45519 | 118/715 |
| 2004/0011287 A1 * | 1/2004 | Ootsuka .............. C23C 16/4581 | 118/715 |
| 2004/0065656 A1 * | 4/2004 | Inagawa ........... H01L 21/67248 | 219/444.1 |
| 2004/0187787 A1 * | 9/2004 | Dawson .............. H01L 21/6833 | 118/728 |
| 2005/0101082 A1 * | 5/2005 | Yokoyama ............. B32B 18/00 | 438/232 |
| 2005/0221552 A1 | 10/2005 | Kao et al. | |
| 2006/0076108 A1 | 4/2006 | Holland et al. | |
| 2006/0130971 A1 | 6/2006 | Chang et al. | |
| 2009/0014323 A1 | 1/2009 | Yendler et al. | |
| 2009/0095621 A1 | 4/2009 | Kao et al. | |
| 2009/0159590 A1 * | 6/2009 | Yonekura ............ H01L 21/6831 | 219/520 |
| 2010/0043708 A1 * | 2/2010 | Choi ................... C23C 16/4586 | 118/723 E |
| 2010/0116788 A1 * | 5/2010 | Singh .................. C23C 16/4586 | 216/66 |
| 2012/0091108 A1 * | 4/2012 | Lin ................... H01L 21/67109 | 219/201 |
| 2012/0211484 A1 | 8/2012 | Zhou et al. | |
| 2012/0285658 A1 | 11/2012 | Roy et al. | |
| 2016/0276197 A1 * | 9/2016 | Kim ................... H01L 21/6831 | |

FOREIGN PATENT DOCUMENTS

| | | |
|---|---|---|
| CN | 102822948 A | 12/2012 |
| KR | 100687378 B1 | 2/2007 |

OTHER PUBLICATIONS

Chinese Office Action dated Jul. 20, 2018 for Application No. 201510362516.5.

* cited by examiner

CHAMBER APPARATUS FOR CHEMICAL ETCHING OF DIELECTRIC MATERIALS

CROSS-REFERENCE TO RELATED APPLICATIONS

This application claims benefit of U.S. provisional patent application Ser. No. 62/018,602, filed Jun. 28, 2014, which is herein incorporated by reference.

BACKGROUND

1. Field

Implementations of the present disclosure generally relate to an apparatus for use in a processing chamber. More specifically, implementations of the present disclosure relate to a pedestal heater having multiple heating zones.

2. Description of the Related Art

A pedestal heater provides thermal control over a substrate during processing and is used as a moving stage to adjust the position of the substrate in a processing chamber. A typical pedestal heater may include a horizontal plate having a heating element and a vertical shaft attached to the bottom center of the horizontal plate. The temperature of such a single-zone pedestal heater is usually measured and controlled by a thermocouple that is in contact with the horizontal plate. The shaft provides support to the heater plate and serves as a path through which terminals of the heating element and thermocouple connect outside the processing chamber.

Semiconductor processes are usually very sensitive to the temperature uniformity or profile of the pedestal heaters. An ideal temperature uniformity or profile may be achieved by careful design of the heating element under certain conditions such as temperature set point, chamber pressure, gas flow rate, etc. The industry have also developed zoned pedestal heater to enable the heating requirements of certain zones to be given preference if desired. However, in some processes the pedestal heater and the substrate disposed thereon may both be operated at a relatively higher temperature within the processing chamber, so it can be difficult to precisely control the temperature profile of the pedestal heater at different regions if a temperature profile desired on, for example, the center region of the substrate is different than the temperature profile on, for example, the outside region of the substrate. Therefore, actual conditions during some semiconductor processes often deviate from the design condition and, as a result, the ideal temperature uniformity or profile cannot be maintained.

Thus, there is a need in the art for an improved pedestal heaters and methods for heating a substrate.

SUMMARY

Implementations of the present disclosure generally provide improved methods and pedestal heaters having the ability to control the amount of heat at different regions of the substrate surface on a fine scale (a few degrees Celsius).

In one implementation, a pedestal heater for a processing chamber is provided. The pedestal heater includes a temperature-controlled plate having a first surface and a second surface opposing the first surface. The temperature-controlled plate includes a first zone comprising a first set of heating elements, a second zone comprising a second set of heating elements, the second zone surrounding the first zone, and a continuous annular thermal choke disposed between the first zone and the second zone. The pedestal heater also includes a substrate receiving plate having a first surface and a second surface opposing the first surface, wherein the second surface of the substrate receiving plate is coupled to the first surface of the temperature-controlled plate.

In another implementation, the pedestal heater includes a substrate receiving plate having an upper surface and a bottom surface opposing the upper surface, and a temperature-controlled plate having an upper surface and a bottom surface opposing the upper surface, wherein the upper surface of the temperature-controlled plate is coupled to the bottom surface of the substrate receiving plate. The temperature-controlled plate includes a first zone disposed in a central region of the temperature-controlled plate, and the first zone includes a first set of heating elements. The temperature-controlled plate also includes a second zone disposed around the first zone, and the second zone comprising a second set of heating elements. A groove is disposed between the first zone and the second zone. The groove extends through the temperature-controlled plate from the bottom surface to the upper surface, wherein the groove extends into the substrate receiving plate.

In yet another implementation, a method of processing a substrate in a processing chamber is provided. The method includes maintaining a chamber body of the processing chamber at a first temperature, cooling a first zone and a second zone of a temperature-controlled plate formed within a pedestal heater to a second temperature, wherein the second temperature is about 5° C. or less below the first temperature, and the pedestal heater is disposed within the chamber body. The method also includes introducing a plasma generated from a gas mixture into a processing volume defined between the pedestal heater and a gas distribution plate, exposing a surface of a substrate disposed on the pedestal heater to the plasma to form a material layer on the surface of the substrate, wherein the substrate has a diameter covering the first zone and the second zone of the temperature-controlled plate. The method further includes heating the first zone of the temperature-controlled plate to a third temperature corresponding to the first temperature while maintaining the second zone of the temperature-controlled plate at the second temperature to create a temperature gradient between the first zone and the second zone, wherein the temperature gradient causes the material layer above the first zone to be etched at a rate relatively faster than the material layer above the second zone.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
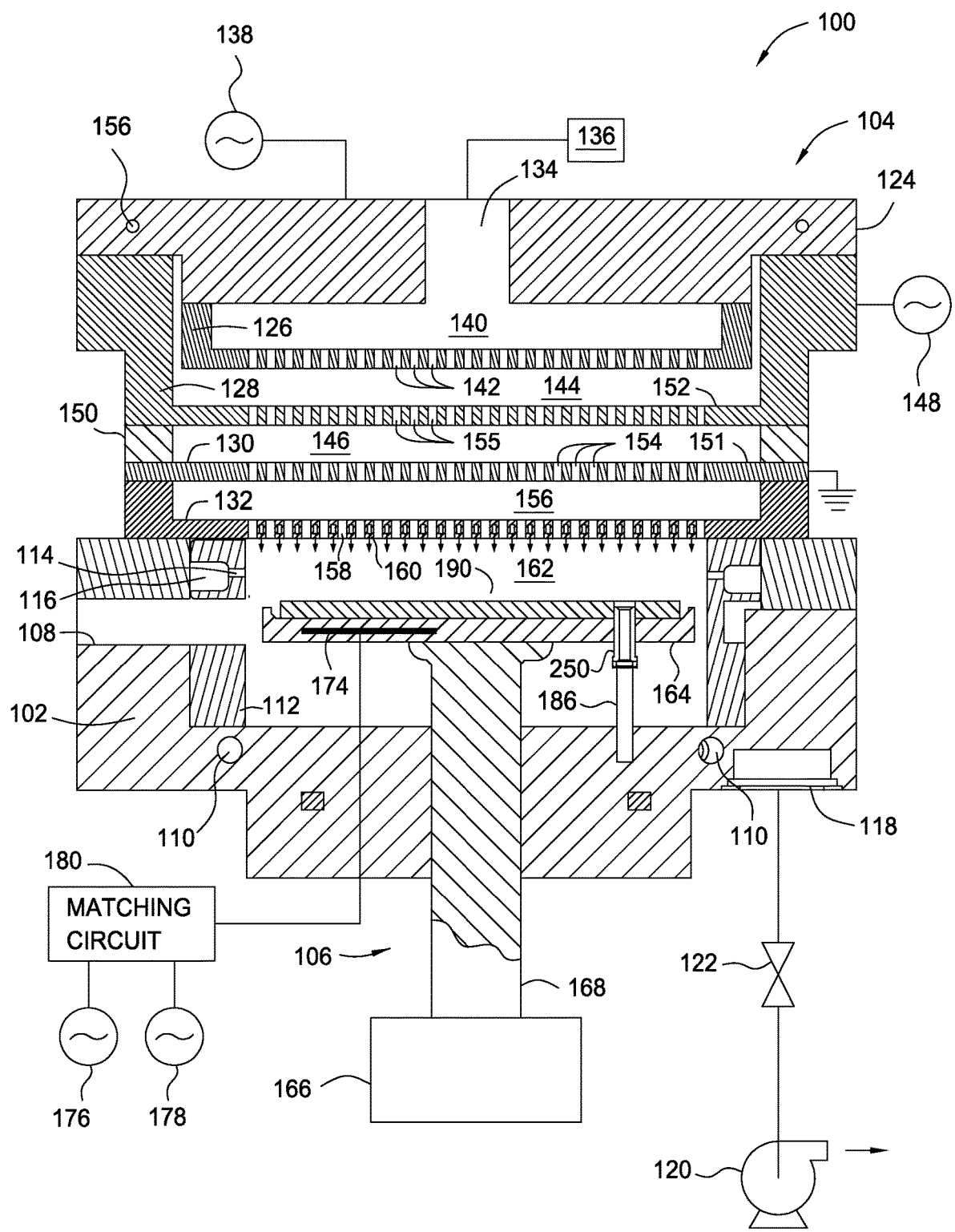
FIG. 1 illustrates a cross-sectional view of an exemplary processing chamber that may be used to process a semiconductor substrate according to implementations of the present disclosure.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

Implementations of the present disclosure generally provide improved methods and pedestal heaters having the ability to control the amount of heat at different regions of the substrate surface on a fine scale (a few degrees Celsius). In various implementations, the pedestal heater may be a dual-zone pedestal heater having a continuous thermal choke separating an inner heating zone from an outer heating zone. The continuous thermal choke enables a very small temperature gradient to be created and manipulated between the inner heating zone and the outer heating zone, allowing center-fast or edge-fast etching profile to achieve on the surface of the substrate even if the pedestal heater and the substrate are operating at relatively higher temperatures. Details of the disclosure and various implementations are discussed below.

Exemplary Chamber Hardware

FIG. 1 illustrates a cross-sectional view of an exemplary processing chamber 100 that may be used to process a semiconductor substrate 190. The processing chamber 100 may be particularly useful for performing a thermal or plasma-based process. For example, the processing chamber 100 may be configured to dry etch or remove a material from a substrate. The processing chamber 100 is particularly suited for isotropic dry etching of a material with high selectivity and minimum damage to the substrate. In one implementation, the dry etching is performed using fluorine-containing gas. Processing chambers that may be adapted for practicing implementations of the present disclosure may include, but is not limited to, a Siconi™ processing chamber, available from Applied Materials, Inc. in Santa Clara, Calif. It is noted that other vacuum processing chambers, including those available from other manufactures may also be adapted to practice various implementations of present disclosure.

In one implementation, the processing chamber 100 is a capacitively coupled plasma processing chamber that provides thermal and plasma processing of a substrate. The processing chamber 100 may be configured to operate at a pressure level of less than about 20 Torr, for example, about 1 Torr. The processing chamber 100 generally includes a chamber body 102, a lid assembly 104, and a pedestal heater 106. The lid assembly 104 is disposed at an upper end of the chamber body 102, and the pedestal heater 106 is at least partially disposed within the chamber body 102, for example, at the opposite end of the chamber body 102 relative to the lid assembly 104. The chamber body 102 also includes a slit valve opening 108 formed in a sidewall thereof to provide access to an interior of the processing chamber 100. The slit valve opening 108 is selectively opened and closed to allow access to the interior of the chamber body 102 by an external substrate handling robot (not shown).

In one or more implementations, the chamber body 102 includes a channel 110 formed therein for flowing a heat transfer fluid therethrough. The heat transfer fluid can be a heating fluid or a coolant and is used to control the temperature of the chamber body 102 during processing.

The chamber body 102 may further include a liner 112 that surrounds the pedestal heater 106. The liner 112 is removable for servicing and cleaning. The liner 112 can be made of a metal or metal alloy such as aluminum or stainless steel, a ceramic material such as aluminum nitride or aluminum oxide, or any other process compatible material. In one or more implementations, the liner 112 includes one or more apertures 114 and a pumping channel 116 formed through the liner 112 that is in fluid communication with a vacuum port 118. The apertures 114 provide a flow path for gases within the interior of the processing chamber 100 to enter the pumping channel 116, which routes the gases within the processing chamber 100 to the vacuum port 118. A vacuum system is coupled to the vacuum port 118 to regulate the flow of gases through the processing chamber 100. The vacuum system includes a vacuum pump 120 and a throttle valve 122.

The lid assembly 104 includes a plurality of stacked components configured to form one or more volumes therebetween. In one implementation, the lid assembly 104 includes a lid 124, a blocker 126, a faceplate 128, a selectivity modulation device (SMD) 130, and a gas distribution plate 132. The lid 124 is coupled to a first power source 138, such as an RF power supply, configured to operate at between about 0 and about 3000 W at a frequency between about 400 kHz and about 60 MHz. In one example, the first power source 138 is configured to deliver about 30 Watts to about 1500 Watts at a frequency of about 13.56 MHz. In one implementation, the lid 124 may include one or more embedded channels or passages for housing a heater or routing heating fluid to provide temperature control of the lid assembly 104.

The lid 124 includes an inlet 134 which is in fluid communication with a remote plasma generator 136 which is coupled to a first gas source (not shown). In one implementation the first gas source provides fluorine. The lid 124 is disposed vertically above the blocker 126 and configured to deliver a first plasma through the inlet 134 from the remote plasma generator 136 into a first volume 140 confined between the lid 124 and the blocker 126.

The blocker 126 is coupled to the lid 124 (therefore RF hot) and includes a plurality of apertures 142 configured to filter out neutral species from the first plasma to allow ions and radicals to pass therethrough. The blocker 126 is disposed vertically above the faceplate 128, thereby predominantly allowing only ions and radicals from the first plasma to enter a second volume 144 confined between the blocker 126 and the faceplate 128. Ions and radicals from the first plasma in the second volume 144 are distributed through the faceplate 128 to a third volume 146.

In one implementation, the faceplate 128 and the SMD 130 form an upper and lower electrode, respectively, confining the third volume 146 therebetween. The faceplate 128 is connected to a second power source 148, such as an RF power supply, and the SMD 130 is connected to ground, thereby forming a capacitance between the upper and lower electrodes 128, 130. If desired, the lower electrode 130 may electrically float. The upper and lower electrodes 128, 130 may be made of highly doped silicon or metal, such as aluminum, stainless steel, etc. In some implementations, the upper and lower electrodes 128, 130 may be coated with a protective layer comprising alumina or yttrium oxide. An isolator 150 is disposed between the faceplate 128 and the SMD 130 and configured to electrically isolate the faceplate 128 and the SMD 130. In one implementation, the isolator 150 is fabricated from a ceramic.

The faceplate 128 may include a perforated plate 152. A plurality of apertures 155 in the faceplate 128 are configured to uniformly deliver the ions and radicals from the second volume 144 to the third volume 146. The SMD 130 may include a perforated plate 151 having a plurality of apertures 154. The plurality of apertures 154 in the SMD 130 are configured to control the ion/radical ratio to tune the gas selectivity provided to a fourth volume 156 defined between the SMD 130 and the gas distribution plate 132. The SMD 130 is configured to filter out a desired amount of ions and allow a desired amount of radicals to pass therethrough to the fourth volume 156. The ion/radical ratio may be selected based on the processing requirements.

The gas distribution plate 132 may be a substantially disc-shaped component including a plurality of first apertures 158 and second apertures 160 to distribute the flow of gases therethrough. The first and second apertures 158,160 form a dual-zone gas distribution plate 132 disposed above the pedestal heater 106. In one implementation, the first apertures 158 are configured to deliver the desired amount of ions and radicals from the fourth volume 156 to a processing volume 162 defined between the gas distribution plate 132 and the pedestal heater 106. In one implementation, the second apertures 160 are in fluid communication with a second gas source (not shown) and configured to deliver the second gas to the processing volume 162 from a side wall of the gas distribution plate 132. Therefore, the dual-zone gas distribution plate 132 advantageously delivers at least two different chemistries to the processing volume 162, and allows the second gas to bypass the first, second, third and fourth volumes 140, 144, 146, and 156 having the first gas. The dual-zone gas distribution plate 132 may be configured to distribute the first gas having the desired ion/radical ratio and second gas across a substrate surface. In various examples, the first gas and/or second gas may be an etchant or ionized active radical, such as ionized fluorine, chlorine, or ammonia, or an oxidizing agent, such as ozone. In some implementations, the second gas may include a plasma containing $NF_3$ and He.

The pedestal heater 106 may include a support plate 164 having a flat, or a substantially flat, surface for supporting the substrate 190 thereon during processing. The support plate 164 may be coupled to an actuator 166 by a shaft 168 which extends through a centrally-located opening formed in a bottom surface of the chamber body 102. The actuator 166 may be flexibly sealed to the chamber body 102 by bellows (not shown) that prevent vacuum leakage from around the shaft 168. The actuator 166 allows the support plate 164 to be moved vertically within the chamber body 102 between a process position and a lower transfer position. The transfer position is slightly below the slit valve opening 108 formed in the sidewall of the chamber body 102.

The pedestal heater 106 can include one or more bores formed through the support plate 164 to accommodate a lift pin 186, which is used for substrate handling and transport. The lift pin 186 is movable within the bore. When actuated, the lift pins 186 project upwards out of the bores and push against a backside surface of the substrate 190, thereby lifting the substrate 190 off the support plate 164. Conversely, the lift pins 186 may be retracted from the extended position to lower the substrate 190, thereby resting the substrate 190 on the support plate 164.

In some implementations, the substrate 190 may be secured to the support plate 164 using a vacuum chuck or an electrostatic chuck. An electrostatic chuck may include at least a dielectric material that surrounds an electrode 174, which may be located within the support plate 164. The electrode 174 may be coupled to a plurality of RF bias power sources 176,178. The dual RF bias power sources 176,178 are coupled to the electrode 174 through a matching circuit 180. The RF bias power sources 176,178 are generally capable of producing an RF signal having a frequency of from about 50 kHz to about 200 MHz and a power between about 0 Watts to about 5000 Watts. Additional bias power sources may be coupled to the electrode 174 to control the characteristics of the plasma as needed. The support plate 164 may have two or more heating zones, and the temperature of some of the heating zones may be controlled by a fluid circulated through a fluid channel embedded in the body of the support plate 164, as will be discussed in further details below.

Exemplary Pedestal Heater

Figure 2:
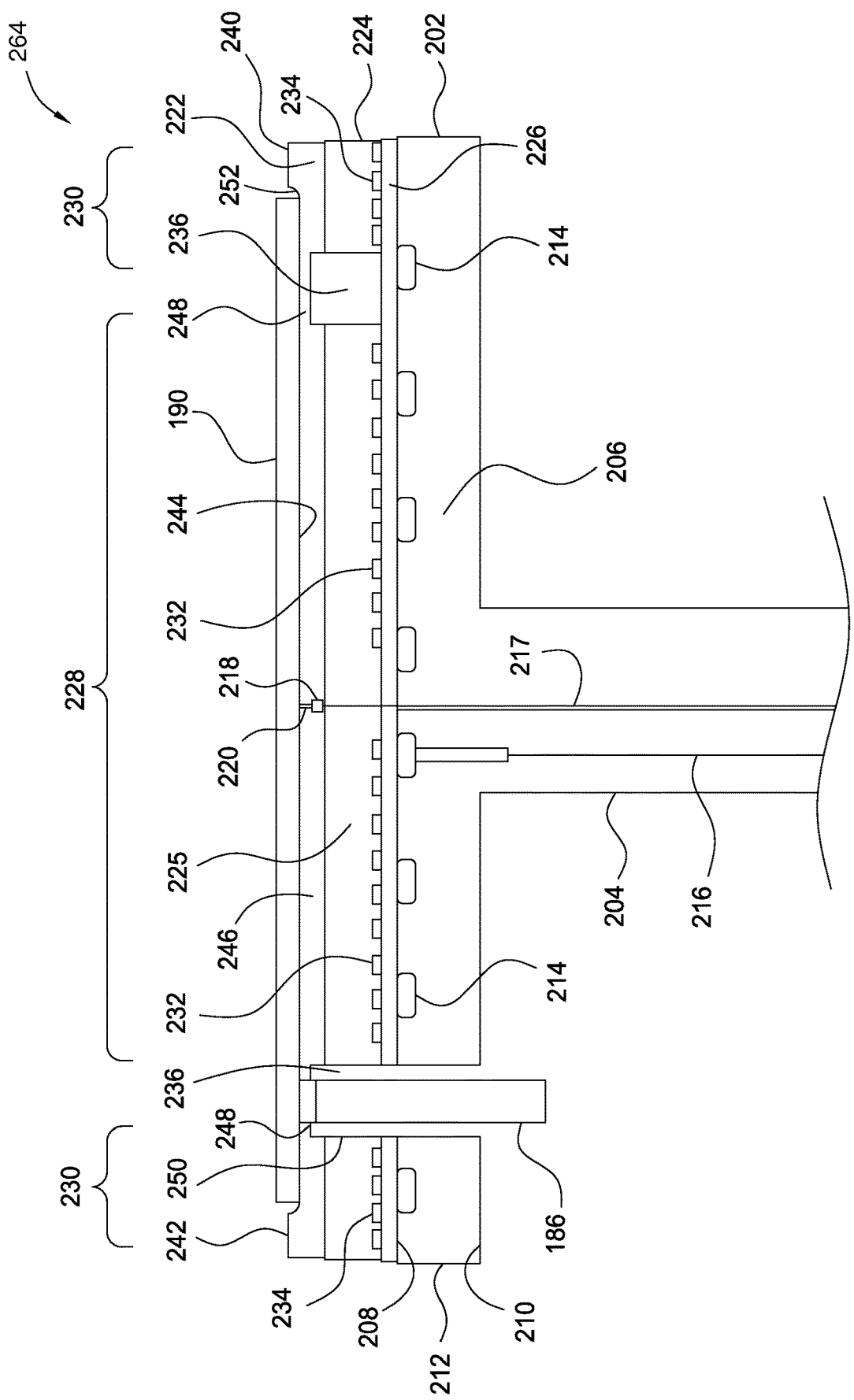
FIG. 2 illustrates a schematic cross-sectional view of a portion of a pedestal heater that may be used in place of the pedestal heater of FIG. 1 according to implementations of the present disclosure.

In an effort to provide a desired temperature profile of the pedestal heater to enable different etch rates on the substrate surface, the inventors have proposed an improved pedestal heater having the ability to change/control the amount of the heat in the center region of the substrate and on the peripheral region of the substrate. FIG. 2 illustrates a schematic cross-sectional view of a pedestal heater 264 that may be used to replace the pedestal heater 106 shown in FIG. 1. It is contemplated that the pedestal heater 264 may also be used in place of the pedestal heater or substrate support assembly found in other thermal and/or plasma enhanced processing chambers.

The pedestal heater 264 includes a base support plate 202 coupling to an actuator (166 shown in FIG. 1) by a shaft 204. The actuator allows the base support plate 202 to be moved vertically within the processing chamber between a process position and a transfer position, in the manner as discussed above with respect to FIG. 1. The base support plate 202 may be in the form of a substantially disk-shaped body 206 having a substantially flat surface. While the base support plate 202 is illustrated and described as a disk-shaped body sized to support a substrate, the base support plate 202 and all other plates of the pedestal heater disposed thereon are not limited to any particular shape. In one aspect, the term "substrate" refers to a round wafer having a 200 mm diameter or 300 mm diameter. In another aspect, the term "substrate" refers to any polygonal, squared, rectangular, curved or otherwise non-circular workpiece, such as a glass substrate used in the fabrication of flat panel displays, for example.

The base support plate 202 can be made of a metal such as aluminum, a metal alloy such as stainless steel, or a ceramic material such as aluminum oxide or aluminum nitride, or any other process compatible material. The disk-shaped body 206 is coupled to the shaft 204. The disk-shaped body 206 generally has an upper surface 208, a lower surface 210 and a cylindrical outer surface 212. In one implementation, the base support plate 202 may have a plurality of fluid channels 214 formed in the disk-shaped body 206 proximate the upper surface 208 to provide temperature control of the base support plate 202. The fluid channels 214 are in fluid communication with a heat transfer fluid conduit 216 provided within the shaft 204 for flowing a heat transfer medium or cooling medium. The fluid channel 214 may be positioned about the shaft 204 in a symmetrical manner to provide a uniform heat transfer to the substrate 190. Particularly, the fluid channels 214 direct the bulk of heat loss from the temperature-controlled plate 224 primarily downwards instead of across heating zones provided in the temperature-controlled plate 224. In one implementation, four sets of fluid channels may be provided in the disk-shaped body 206. More or less number of the fluid channels is contemplated. The heat transfer fluid conduit 216 is in fluid communication with a heat transfer fluid source (not shown). Any suitable heat transfer fluid, such as water, nitrogen, ethylene glycol, or mixtures thereof, may be used. The base support plate 202 can further include an embedded thermocouple (not shown) for monitoring the temperature of the upper surface 208 of the base support plate 202. For example, a signal from the thermocouple may be used in a feedback loop to control the temperature or flow rate of the fluid circulated through the fluid channel 214.

The shaft 204 may also provide a vacuum conduit 217 coupling to a plurality of holes 220 through channels 218 (only one is shown) formed within a substrate receiving plate 222. The holes 220 are in fluid communication with a vacuum pump (not shown) through the vacuum conduit 217 to chuck the substrate 190 to an upper surface of the substrate receiving plate 222 by pulling a vacuum through the holes 220 and channels 218. Under certain conditions, the vacuum conduit 217 can be used to supply a purge gas to the surface of a substrate receiving plate 222 to prevent a reactive gas/plasma or byproduct from contacting the backside of the substrate. In some implementations, a purge gas having a relatively high thermal conductivity, such as helium, hydrogen, or a combination thereof, may be supplied to the backside of the substrate during the etching process to provide better heat transfers between the substrate receiving plate 222 and the substrate 190. The thermal conductivity of the pedestal heater can be enhanced by changing the gas pressure between the substrate receiving plate 222 and the substrate 190 since the thermal conductivity of the gas is a function of its pressure. In one example, the purge gas may be applied to the backside of the substrate at a pressure level (e.g., 10 Torr to 100 Torr) that is substantially lower than atmospheric pressure to improve the thermal conductivity between the substrate receiving plate 222 and the substrate 190.

In one implementation, a blocking plate 226 made of aluminum, copper, ceramic, quartz, stainless steel, among others, may be optionally formed on the pedestal heater 264. The blocking plate 226 may have a diameter corresponding to the diameter of the base support plate 202. In most cases, the blocking plate 226 is sized to cover the fluid channels 214. The blocking plate 226 confines the heat transfer fluid within the fluid channels 214 and isolates the heat transfer fluid from the heating elements of the temperature-controlled plate 224. For a pedestal heater having a diameter of about 300 mm, the blocking plate 226 may have a thickness of about 5 mm to about 30 mm.

In one implementation, the pedestal heater 264 also includes a temperature-controlled plate 224 formed on the blocking plate 226. If the blocking plate 226 is not used, the temperature-controlled plate 224 is formed on the base support plate 202. The temperature-controlled plate 224 is generally in the form of a substantially disk-shaped body 225 having a substantially flat surface. The temperature-controlled plate 224 may be made of a metal such as aluminum, a metal alloy such as stainless steel, or a ceramic material such as aluminum oxide or aluminum nitride, or any other process compatible material. The temperature-controlled plate 224 may have a diameter corresponding to the diameter of the base support plate 202. For a pedestal heater having a diameter of about 300 mm, the temperature-controlled plate 224 may have a thickness of about 5 mm to about 30 mm.

In some implementations, the temperature-controlled plate 224 may include two or more heating zones when viewed from the top of the plate 224. The temperature-controlled plate 224 may have a plurality of heating elements embedded in the disk-shaped body 225 to heat the different heating zones of the temperature-controlled plate 224. The heating zones may have any suitable arrangements to provide a desired temperature profile for the base support plate 202. For example, the temperature-controlled plate 224 may have heating zones arranged in multiple concentric circular zones and/or ring-shaped zones of increasing diameter. In other implementations, the temperature-controlled plate 224 may have heating zones arranged in a radially symmetrical or unsymmetrical pattern. In either case, each heating zone may have one or more independently PID (Proportional Integral Derivative) controlled heating elements connecting to an embedded thermocouple for temperature reading and control.

In one implementation, the temperature-controlled plate 224 has an outer zone 230 concentrically surrounding an inner zone 228. The inner zone 228 may cover the majority of the area of temperature-controlled plate 224, while the outer zone 230 may cover the perimeter portions of the temperature-controlled plate 224. In some implementations, the inner zone 228 may have a surface coverage of about 60% to about 90% of the upper surface of the temperature-controlled plate 224.

The temperature-controlled plate 224 may include a first set of heating elements 232 provided within the disk-shaped body 225. In one implementation, the first set of heating elements 232 includes four heating elements. The layout of the first set of heating elements 232 generally corresponds to the region defined by the inner zone 228. The first set of heating elements 232 may be arranged in a radially symmetrical manner about the shaft 204. The temperature-controlled plate 224 may also include a second set of heating elements 234 provided within the disk-shaped body 225. In one implementation, the second set of heating elements 234 includes two heating elements. The layout of the second set of heating elements 234 generally corresponds to the region defined by the outer zone 230. The second set of heating elements 234 may be arranged in a radially symmetrical manner about the shaft 204. Note that it is contemplated that the number of first and second sets of heating elements may vary as desired. Increased number of heating elements is expected to improve heating reliability.

The temperature profile of the pedestal heater 264 at the inner and outer zones 228, 230 may be adjustable based on the ratio of power directed to the first and second sets of heating elements 232, 234. The first and second sets of heating elements 232, 234 may use any suitable heating approaches, such as resistive heating, non-resistive heating, inductive heating, radiant heating, or any combination thereof. In some implementations, the first set of heating elements 232 may use resistive heating approach to heat the inner zone 228 while the second heating element 234 may use non-resistive heating approach to heat the outer zone 230, or vice versa. In some implementations, both the first and second sets of heating elements 232, 234 may use resistive heating approach to heat the inner and outer zones 228, 230.

The resistive heating elements may be composed of a resistive metal, a resistive metal alloy, or a combination of the two. Suitable materials for the resistive heating elements may include those with high thermal resistance, such as tungsten, molybdenum, titanium, or the like. The first and second sets of heating elements may be fabricated with a material having thermal properties, e.g., coefficient of thermal expansion, substantially matching at least one or both the thermal properties of a substrate receiving plate 222 and the underlying blocking plate 226 (if used) to reduce stress caused by mismatched thermal expansion. Non-resistive heating methods may include, for example, application of an internal or external heat exchange source.

A substrate receiving plate 222 is disposed on the temperature-controlled plate 224. The substrate receiving plate 222 may be in the form of disk-shaped body 246 having a diameter substantially corresponding to the temperature-controlled plate 224. The substrate receiving plate 222 may be made of aluminum, copper, ceramic, quartz, stainless steel or any suitable process compatible material.

The substrate receiving plate 222 may have features configured to support/confine the movement of the substrate, or to prevent undesired erosion of the areas of the substrate during the process. The substrate receiving plate 222 may be configured to be removable from the temperature-controlled plate 224. In some implementations, for example, the substrate receiving plate 222 may have a protrusion 240 extending upwardly from its upper surface 242 around the periphery of the substrate receiving plate 222, and a recessed area 244 surrounded by the protrusion 240. The recessed area 244 may be sized and configured to receive the substrate 190 such that a top surface of the substrate 190, once is placed within the recessed area 244, is substantially flush with or slightly above the top surface of the protrusion 240. The protrusion 240 may have an annular ring shape. In some implementations, the protrusion 240 may have an inner circumferential surface 252 abutting the recessed area 244. The inner surface 252 of the protrusion 240 may be slanted relative to a top surface of the protrusion 240 at an angle above zero, for example about 30 degrees to about 150 degrees, such as between about 100 degrees and about 120 degrees. The protrusion 240 and the recessed area 244 confine the movement of the substrate during the process. For a pedestal heater having a diameter of about 300 mm, the substrate receiving plate 222 may have an overall thickness of about 5 mm to about 30 mm. The protrusion 240 may have a thickness of about 0.5 mm to about 5 mm. Note that the protrusion and recessed area are for illustrative purposes and should not be considered as limiting the scope of other possible design variations.

Figure 3:
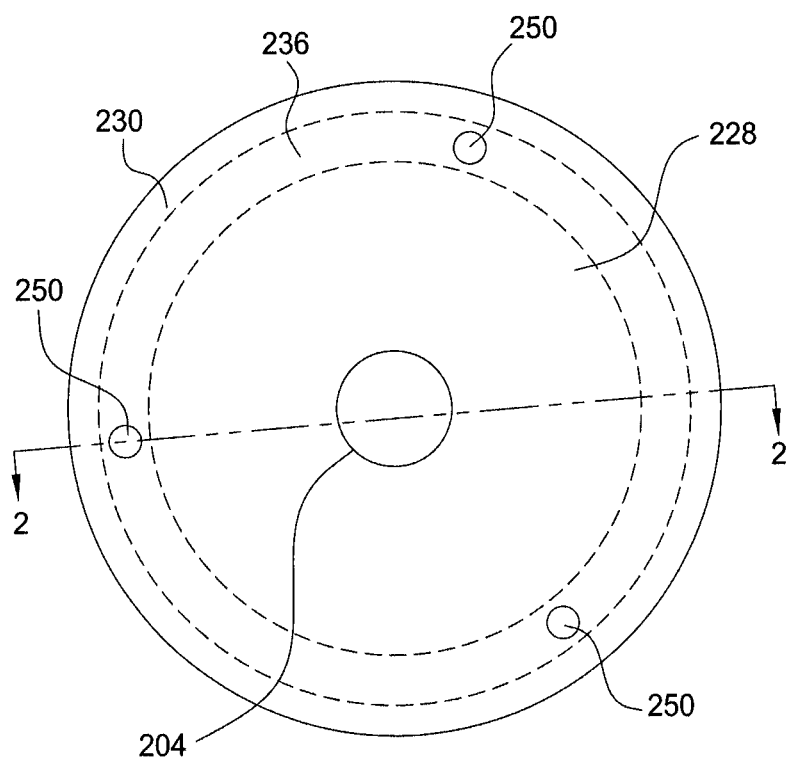
FIG. 3 illustrates a schematic bottom view of the pedestal heater of FIG. 2 according to implementations of the present disclosure.

In various implementations, the pedestal heater 264 further includes an annular groove 236 formed in the disk-shaped body 225 of the temperature-controlled plate 224 between the inner zone 228 and the outer zone 230. The groove 236 generally has a width large enough to thermally isolate the inner zone 228 from the outer zone 230. For a pedestal heater having a diameter of about 300 mm, the groove 236 may have a width of about 1 mm to about 15 mm, for example about 2 mm to about 8 mm. The groove 236 may form through the entire thickness of the temperature-controlled plate 224 to physically isolate the inner zone 228 and the outer zone 230, as shown in FIG. 3, which illustrates a schematic bottom view of the pedestal heater 264 of FIG. 2 showing the inner zone 228 and the outer zone 230 are separated by the continuous groove 236 (shown in phantom) running around the periphery of the pedestal heater 264. FIG. 3 also shows the pedestal heater 264 having three bores 250 each configured to accommodate a lift pin 186 (shown in FIG. 2). The bores 250 are spaced apart at a regular interval along the circumference of the pedestal heater 264 at regions where the groove 236 is located. As discussed previously, the lift pin is movable within its respective bore 250 for substrate-handling and transport. As can be better seen in FIG. 2, the bores 250 generally form through the substrate receiving plate 222, the temperature-controlled plate 224, the blocking plate 226, and the base support plate 202 to allow each lift pin to pass through its respective bore to move the substrate from either the lower position or the upper position.

In some implementations, the groove 236 further extends into a thickness of the disk-shaped body 246 of the substrate receiving plate 222. In one implementation shown in FIG. 2, the groove 236 is formed through the entire thickness of the temperature-controlled plate 224 and extended upwardly into the substrate receiving plate 222 at a thickness in the recessed area 244. In most cases, the groove 236 does not extend through the entire thickness of the substrate receiving plate 222. As a result, the disk-shaped body 246 of the substrate receiving plate 222 disposed above the inner zone 228 is connected to the disk-shaped body 246 disposed above the outer zone 230 by a thin bridge 248. The bridge 248 physically separates the groove 236 from the substrate 190. With this design, the substrate does not touch the heating elements 232, 234 over the length of the groove 236, which helps maintain the steep temperature gradient. In most examples, the groove 236 is formed in a bottom of the temperature-controlled plate 224, leaving the bridge 248 contiguously and integrally connecting the inner zone 228 and the outer zone 230.

While the thickness of the bridge 248 is shown significantly thinner than the thicknesses of the disk-shaped body 246 disposed above the inner and outer zones 228, 230, the bridge 248 should have a minimum thickness to provide required mechanical strength of the structure between the recessed area 244 and the protrusion 240.

The depth of the groove 236 and the thickness of the bridge 248 are carefully selected to provide a limited heat transfer (e.g., a thermal choke) between the substrate 190 and the substrate receiving plate 222 (and thus the temperature-controlled plate 224). In cases where the substrate receiving plate 222 and the temperature-controlled plate 224 have an overall thickness of about 5 mm to about 30 mm, the groove 236 may have a height of about 2 mm to about 29.5 mm. The bridge 248 may have a thickness of about 0.5 mm to about 28 mm, and a width of about 2 mm to about 8 mm.

Regardless of whether or not the groove 236 is extended into the substrate receiving plate 222, the groove 236 and the bridge 248 provide a thermal choke between the inner zone 228 and the outer zone 230. Therefore, the heat transfer between the inner zone 228 and the outer zone 230 that would otherwise pass through the disk-shaped body 225 of the temperature-controlled plate 224 if it was devoid of the groove 236 and bridge 248 is greatly reduced. The groove 236 (i.e., thermal choke) thus enables a very precise temperature gradient to be created and manipulated between the inner zone 228 and the outer zone 230, allowing center-fast (inner zone) or edge-fast (outer zone) etching profile to achieve on the surface of the substrate even if the pedestal heater and the substrate are operating at relatively higher temperatures.

In addition, as the pedestal heater 264 may be maintained at a temperature slightly below the ambient temperature of the processing chamber prior to, or during the initial stage of an etching process, one will be able to precisely control the temperature of the inner zone 228 and/or outer zone 230 with minimum amount of heat directed to the inner zone 228 (to obtain center-fast etching profile), or to the outer zone 230 (to obtain edge-fast etching profile), as will be discussed in more detail below. In this example, since the amount of heat to be added to the inner zone 228/outer zone 230 is so small and the temperature-controlled plate 224 and the substrate receiving plate 222 are all made of high thermal conductive material such as aluminum, the provision of a wide, continuous thermal choke between the inner zone 228 and the outer zone 230 can effectively restrict heat flow from the outer zone 230 to the inner zone 228 (or vice versa), which would otherwise affect the desired temperature profile of the substrate receiving plate 222 that contacts the substrate.

Furthermore, the bores 250 may be formed through the bridge 248 disposed between the groove 236 and the substrate 190 to mask the slow heat transfer from the substrate 190 to the lift pin bores 250, thus preventing local spots on the substrate's surface that may negatively affect the substrate etching profile. Since the difference in the heat flow from the substrate 190 to the substrate receiving plate 222 (and thus the temperature-controlled plate 224) at regions where the lift pin bores are located is very similar to other portions of the bridge 248, hot spots on the substrate over lift pin bores 250 as would normally be seen in the conventional pedestal heaters is substantially no longer a concern because the heat transfer is essentially uniform above the groove 236.

An exemplary etching process will now be described to explain how a processing chamber 100 of FIG. 1 having the inventive pedestal heater of FIG. 2 may benefit an etching process. For simplicity and ease of description, an exemplary dry etch process for removing a dielectric material, such as a silicon oxide, using a plasma generated from an ammonia ($NH_3$) and nitrogen trifluoride ($NF_3$) gas mixture will be described with respect to the processing chamber 100 of FIG. 1. The dry etch process may begin by placing a substrate into the processing chamber through the slit valve opening 108 and disposed on the upper surface of the pedestal heater 264. The substrate may be secured to the substrate receiving plate 222 by pulling a vacuum through the holes 220 and channels 218 via vacuum conduit 217. The pedestal heater 264 is then lifted to a processing position within the chamber body 102, if not already in a processing position. The chamber body 102 may be maintained at a desired temperature of, for example, between 50° C. and 200° C., such as about 80° C. The temperature of the chamber body 102 may be maintained by passing a heat transfer fluid through the channel 110.

In one implementation, the substrate is cooled to a temperature slightly below the temperature of the processing chamber or ambient temperature of the processing chamber, for example about 40° C. or less, for example about 35° C. or less, for example about 30° C. or less, for example about 25° C. or less, for example about 20° C. or less, for example about 15° C. or less, for example about 10° C. or less, for example about 5° C. or less, such as about 1° C. or 2° C., which is the result of the temperature of the chamber body 102 (about 80° C. in this example). In some embodiments, the substrate may be cooled to a temperature slightly higher than the temperature of the processing chamber or the ambient temperature of the processing chamber, for example about 1° C. or 2° C. or higher, for example about 5° C. or higher, for example about 10° C. or higher, for example about 20° C. or higher, for example about 25° C. or higher, for example about 30° C. or higher, for example about 35° C. or higher, for example about 40° C. or higher.

To reach the desired substrate temperature specified above, the pedestal heater may be cooled and maintained at a temperature of about 78° C. to 79° C. by continuously flowing a cooling fluid through the fluid channel 214. The temperature of the inner zone 228 and the outer zone 230 is thus maintained at a temperature of about 78° C. to 79° C., which is about 1° C. or 2° C. below the ambient temperature of the processing chamber 100.

Plasma generated from suitable etching gas mixture, for example ammonia and nitrogen trifluoride gases, is then introduced into the inlet 134 from a remote plasma generator 136. The plasma flows through the blocker 126, the faceplate 128, SMD 130, and the gas distribution plate 132 to filter out a desired amount of ions, allowing a desired amount of radicals to flow to the processing volume 162 and react with the substrate surface. Alternatively, the etching gas mixture may be introduced into the inlet 134 and excited into plasma form by applying an RF power to the electrodes (e.g., faceplate 128 and SMD 130). A purge gas or carrier gas such as argon, helium, hydrogen, nitrogen, or mixtures thereof, may also be introduced into the processing chamber before or concurrently with the gas mixture. In some aspects, one or more of the etching gases and/or purge or carrier gas may be flowed into the processing volume 162 through second apertures 160 of the gas distribution plate 132 from the sidewall of the gas distribution plate 132. The plasma reacts with the silicon oxide surface to form ammonium hexafluorosilicate $(NH_4)_2SiF_6$, $NH_3$, and $H_2O$ products. The $NH_3$, and $H_2O$ are vapors at processing conditions and can be removed from the processing chamber 100 by the vacuum pump 120. A thin film of $(NH_4)_2SiF_6$ is left behind on the substrate surface. The pedestal heater 264 is then heated to a temperature sufficient to dissociate or sublimate the thin film of $(NH_4)_2SiF_6$ into volatile $SiF_4$, $NH_3$, and HF products.

Depending upon the etching process to be performed within the processing chamber, the temperature of the inner zone 228 and the outer zone 230 can be controlled so that a center-fast or edge-fast etching profile is realized to the material layer (i.e., thin film of $(NH_4)_2SiF_6$) formed on the substrate. Typically, a temperature of 80° C. or more is used to effectively sublimate and remove the thin film from the substrate. In cases where a center-fast etching profile is desired on the substrate surface, the first set of heating elements 232 may be controlled to heat the temperature of the inner zone 228 back up to about 80° C., while the outer zone 230 is still maintained at a temperature of about 78° C. to 79° C. Therefore, a temperature gradient of about 1° C. to about 2° C. is created between the inner zone 228 and the outer zone 230. Since the inner zone 228 is heated to a temperature of about 80° C. that is relatively higher than the outer zone 230 (about 78° C. to 79° C.), the center-fast etching profile on the substrate surface is achieved. This temperature gradient can be effectively maintained due to the presence of the bridge 248 and groove 236 (i.e., thermal choke) located between the inner zone 228 and the outer zone 230, which limits or minimizes the heat transfer between the inner zone 228 and the outer zone 230. In addition, the amount of power (heat) required to achieve center-fast etching profile can be kept to minimum since the temperature to be added to the inner zone 228 is only 1° C. or 2° C. The groove 236 therefore enables a very small temperature gradient (a few degrees Celsius) to be precisely created between the inner zone 228 and the outer zone 230.

In cases where a edge-fast etching profile is desired, the second set of heating elements 234 may be controlled vice versa to heat the temperature of the outer zone 230 back up to create the desired temperature gradient between the inner zone 228 and the outer zone 230. Note that a larger or smaller temperature gradient is contemplated depending upon the process recipe/etching profile required on the substrate surface. The temperature range given here is for illustrative purposes only and should not be considered as limiting the scope of other possible etching processes. A person of ordinary skill in the art can easily determine the temperature required to efficiently and effectively vaporize a desired thin film without damaging the underlying substrate.

Once the film has been removed from the substrate, the chamber is purged and evacuated. The processed substrate is then removed from the processing chamber 100 by lowering the substrate to the transfer position, de-chucking the substrate, and transferring the substrate out of the processing chamber 100 through the slit valve opening 108.

Figure 4:
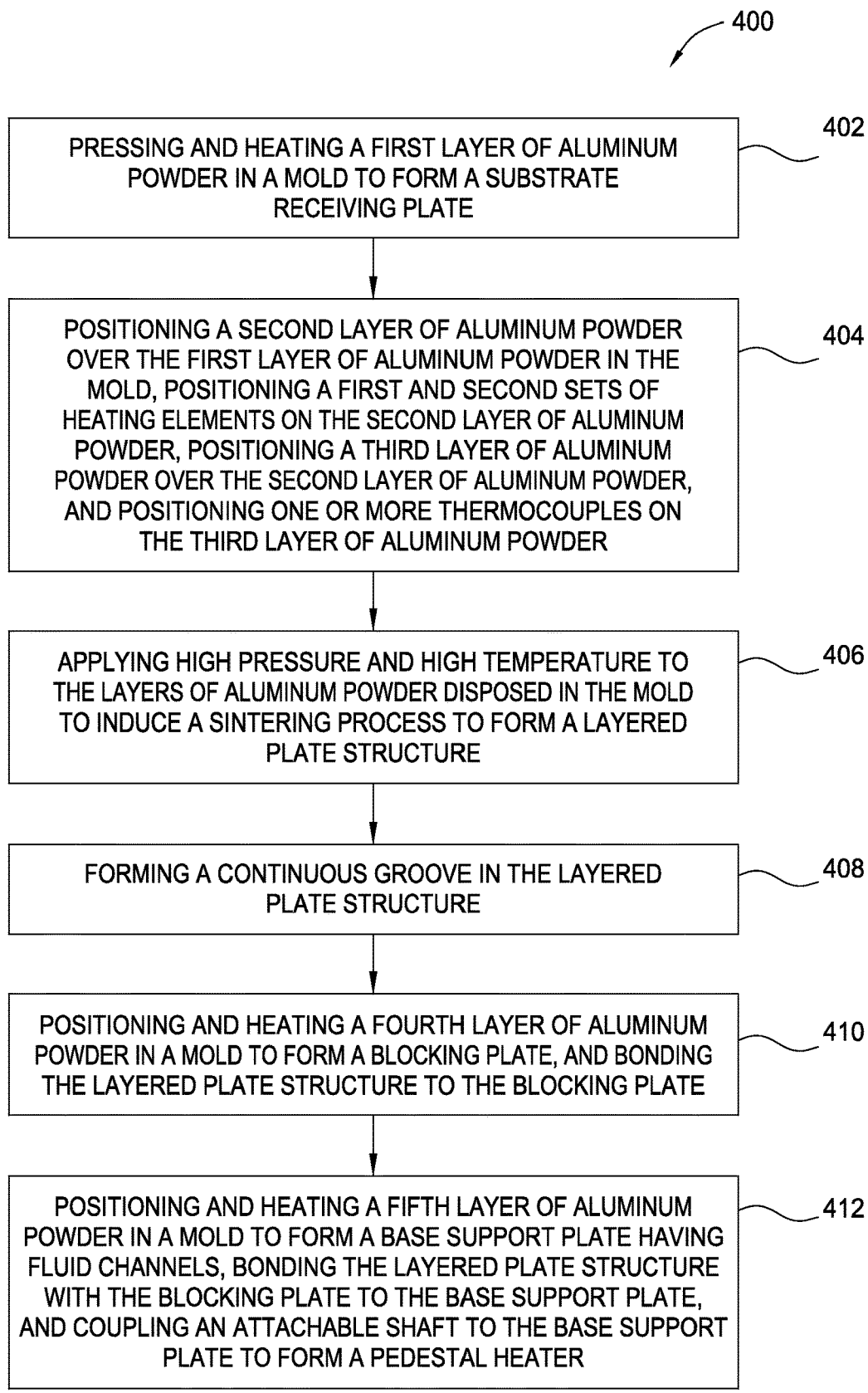
FIG. 4 is a flowchart illustrating an exemplary method of manufacturing a multi-zone pedestal heater of FIG. 2.

FIG. 4 is a flowchart illustrating an exemplary method 400 of manufacturing a multi-zone pedestal heater of FIG. 2 or a similar pedestal heater. The method 400 begins at block 402 by forming a substrate receiving plate. The substrate receiving plate may be formed using a hot press sintering process in which a first layer of thermal conductive material, for example aluminum, in powder form is pressed in a mold and heated. The mold may have predetermined molding patterns so that the substrate receiving plate is formed with desired substrate supporting features, for example the protrusion 240 and recessed area 244 of FIG. 2.

At block 404, a temperature-controlled plate is positioned onto a surface of the substrate receiving plate opposing the substrate supporting features. The temperature-controlled plate may be formed by providing a second layer of thermal conductive material, for example aluminum, in powder form over the first layer of aluminum powder in the mold, and then positioning a first set of heating elements and a second set of heating elements on the second layer of aluminum powder. The layout of the first set of heating elements and second set of heating elements are arranged so that the first set of heating elements located at the center region of the second layer of aluminum powder create an inner heating zone while the second set of heating elements located at the peripheral region create an outer heating zone, as discussed above with respect to FIG. 2. Once the first and second layers of aluminum powder and the first and second sets of heating elements are in place, a third layer of thermal conductive material, for example aluminum, in powder form may be positioned over the second layer of aluminum powder to encapsulate the heating elements. Thereafter, one or more thermocouples may be positioned onto the third layer of aluminum powder.

At block 406, once the layers of aluminum powder, heating elements, and the thermocouples are in place, high pressure and high temperature may be applied to the layers of aluminum powder disposed in the mold to induce a sintering process. The result is the formation of a layered plate structure having heating elements and thermocouples embedded therein.

At block 408, a continuous groove is formed into the layered plate structure until a desired thickness of the groove is obtained. The continuous groove may be formed by any practicable method, such as milling, blasting, grinding, or etching process. The groove may extend through the temperature-controlled plate and into a portion of the substrate receiving plate. The groove generally has an arrangement running around the circumference of the temperature-controlled plate in a continuous manner as discussed above with respect to FIG. 2. The groove may alternatively be integrally formed at block 408.

At block 410, the layered plate structure with the continuous groove is bonded to a blocking plate. The layered plate structure may be bonded to the blocking plate using a suitable process such as a sintering process, a brazing process, or a welding process. The blocking plate may be previously formed by a hot press sintering process in which a fourth layer of thermal conductive material, for example aluminum, in powder form is pressed in a mold and heated. The continuous groove is capped by the blocking plate upon bonding of the layered plate structure to the blocking plate.

At block 412, the layered plate structure with the blocking plate is bonded to a base support plate using a suitable process such as a sintering process or a welding process. The base support plate may be formed using a hot press sintering process in which a fifth layer of thermal conductive material, for example aluminum, in powder form is pressed in a mold and heated. The mold may have predetermined molding patterns so that the base support plate is formed with fluid channels, as shown in FIG. 2. Once the layered plate structure is bonded to the base support plate, an attachable hollow shaft is coupled to the base support plate to form the pedestal heater. Alternatively, the pedestal heater can be made up of machined (milled and/or turned) Al plates that are vacuum brazed (or soldering) with thin Al foils. The shaft can function as a conduit for cooling fluid flow, electrical and thermocouple wiring. Note that the pedestal heater may be fabricated vacuum tight throughout the manufacturing process. While not shown or discussed, it is understood that the pedestal heater may be fabricated in a sequence different than those discussed above. Additional steps required to complete a functional pedestal heater may be performed between, before, or after blocks 402-412. For example, electrical conductive wires, connectors, and fluid lines needed for the heating elements, thermocouples and fluid channels may be formed in the temperature-controlled plate and the base support plate during the manufacturing process.

Benefits of the present disclosure include an improved pedestal heater having the ability to control the amount of heat at different regions of the substrate surface on a fine scale. Particularly, the use of a continuous thermal choke in a dual-zone pedestal heater separates an inner heating zone from an outer heating zone. The continuous thermal choke enables a very small temperature gradient to be created and manipulated between the inner heating zone and the outer heating zone, allowing center-fast or edge-fast etching profile to achieve on the surface of the substrate even if the pedestal heater and the substrate are operating at relatively higher temperatures.

While the foregoing is directed to implementations of the present disclosure, other and further implementations of the disclosure may be devised without departing from the basic scope thereof, and the scope thereof is determined by the claims that follow.

We claim:

1. A pedestal heater for a processing chamber, comprising:
   a temperature-controlled plate having a first surface and a second surface opposing the first surface, comprising:
     a first zone comprising a first set of heating elements; and
     a second zone comprising a second set of heating elements, the second zone surrounding the first zone;
   a substrate receiving plate having a first surface and a second surface opposing the first surface, wherein the second surface of the substrate receiving plate is coupled to the first surface of the temperature-controlled plate;
a continuous annular thermal choke disposed between the first zone and the second zone, wherein the thermal choke is a cut-out formed through the entire thickness of the temperature-controlled plate and into a thickness of the substrate receiving plate so that a portion of the substrate receiving plate disposed above the second zone is connected to a portion of the substrate receiving plate disposed above the first zone by a thin bridge;
a bore formed through the thin bridge, wherein the bore opens into the cut-out;
a base support plate having a first surface and a second surface opposing the first surface, the first surface of the base support plate is disposed proximate the second surface of the temperature-controlled plate, and the base support plate has a plurality of fluid channels;
a blocking plate disposed between the base support plate and the temperature-controlled plate, wherein the blocking plate is sized to cover the plurality of fluid channels, wherein an upper surface of the blocking plate is in direct contact with the first and second set of heating elements, wherein the blocking plate physically isolates the plurality of fluid channels from the first and second set of heating elements, wherein at least one fluid channel is disposed below the first zone of the temperature-controlled plate and at least one fluid channel is disposed below the second zone of the temperature-controlled plate; and
a lift pin sized to pass through the bore in the thin bridge.

2. The pedestal heater of claim 1, wherein the first zone covers the majority of the temperature-controlled plate around its central region.

3. The pedestal heater of claim 1, wherein the temperature-controlled plate, the base support plate, and the substrate receiving plate are formed of aluminum, stainless steel, aluminum oxide, or aluminum nitride.

4. A pedestal heater for a processing chamber, comprising:
a substrate receiving plate having an upper surface and a bottom surface opposing the upper surface;
a temperature-controlled plate having an upper surface and a bottom surface opposing the upper surface, the upper surface of the temperature-controlled plate is coupled to the bottom surface of the substrate receiving plate, the temperature-controlled plate comprising:
a first zone disposed in a central region of the temperature-controlled plate, the temperature-controlled plate comprising a first set of heating elements disposed in the first zone; and
a second zone disposed around the first zone, the temperature-controlled plate comprising a second set of heating elements disposed in the second zone;
a cut-out disposed between the first zone and the second zone, the cut-out extending through the temperature-controlled plate from the bottom surface to the upper surface and into a portion of the substrate receiving plate to provide a bridge portion in the substrate receiving plate;
a base support plate having an upper surface and a bottom surface opposing the upper surface, the base support plate having a plurality of fluid channels disposed in the upper surface;
a blocking plate disposed between the base support plate and the temperature-controlled plate, wherein the blocking plate is sized to cover the plurality of fluid channels, wherein an upper surface of the blocking plate is in direct contact with the first and second set of heating elements, wherein the blocking plate physically isolates the plurality of fluid channels from the first and second set of heating elements, wherein at least one fluid channel is disposed below the first zone of the temperature-controlled plate and at least one fluid channel is disposed below the second zone of the temperature-controlled plate;
a bore formed through the bridge portion, wherein the bore opens into the cut-out; and
a lift pin sized to pass through the bore formed through the thin bridge.

5. The pedestal heater of claim 4, wherein the first zone is concentric with the second zone.

6. The pedestal heater of claim 4, wherein the temperature-controlled plate, the base support plate, the blocking plate, and the substrate receiving plate are formed of aluminum, stainless steel, aluminum oxide, or aluminum nitride.

7. The pedestal heater of claim 4, wherein the first and second sets of heating elements are arranged in a radially symmetrical manner about the central region.

8. The pedestal heater of claim 1, wherein the ratio of the thickness of the thin bridge to the combined thickness of the substrate receiving plate and the temperature-controlled plate is about 1:1.05 to about 1:10.

9. The pedestal heater of claim 1, wherein a top surface of the thin bridge portion forms a portion of the first surface of the substrate receiving plate.

* * * * *